United States Patent [19]

Vieira et al.

[11] 3,906,248

[45] Sept. 16, 1975

[54] TIME DELAY CIRCUIT EMPLOYING FIELD EFFECT TRANSISTOR AND DIFFERENTIAL OPERATIONAL AMPLIFIER

[75] Inventors: Joseph G. Vieira, Plainville; Leo A. Plouffe, North Dighton, both of Mass.

[73] Assignee: Texas Instruments, Incorporated, Dallas, Tex.

[22] Filed: Nov. 29, 1971

[21] Appl. No.: 202,765

[52] U.S. Cl. .............. 307/293; 317/141 S; 328/131

[51] Int. Cl. ....................... H03K 5/13; H01H 47/18; G01R 29/02

[58] Field of Search ................................... 307/293; 328/129–131; 317/141 S

[56] References Cited

UNITED STATES PATENTS

| | | | |
|---|---|---|---|
| 3,192,449 | 6/1965 | Brockett | 317/141 S |
| 3,284,080 | 11/1966 | Jones | 307/293 X |
| 3,411,021 | 11/1968 | Elich | 307/293 X |
| 3,473,054 | 10/1969 | Wieczorek | 307/293 |
| 3,491,254 | 1/1970 | Van Ness | 307/293 X |
| 3,569,842 | 3/1971 | Schroyer | 307/293 X |
| 3,575,639 | 4/1971 | Shaw et al. | 317/141 S |
| 3,622,811 | 11/1971 | Houpt | 307/293 |
| 3,671,817 | 6/1972 | Seipp | 317/141 S |

*Primary Examiner*—Stanley D. Miller, Jr.
*Attorney, Agent, or Firm*—John A. Haug; James P. McAndrews; Russell E. Baumann

[57] ABSTRACT

A system is disclosed for controlling the state of energization of a load responsive to an input control signal and includes a timing circuit for providing a predetermined time delay between the initiation of the control signal and a change in the state of energization of the load. The system includes a time delay network having an interconnected resistor and capacitor and an input switch coupled to the capacitor for effecting charging and discharging thereof responsive to the initiation of the control signal. A voltage sensing switch means is coupled to the capacitor for sensing the voltage thereacross in order to produce an energizing signal systematically related to this voltage level. A voltage comparison means having a pair of input terminals and an output terminal is provided. One of the input terminals is adapted to receive a bias signal for maintaining the comparison means in a de-energized state and a second input terminal is coupled to the voltage sensing device for receiving the energizing signal. The comparison means is energized only when the energizing signal is of a sufficient magnitude relative to the bias signal applied in order to provide an output signal responsive to energization thereof, while a selectively operable output switch means is coupled to the output terminal of the comparison means and to the load for controlling the state of energization of the load.

18 Claims, 5 Drawing Figures

INVENTOR.
Leo A. Plouffe
BY Joseph Gerard Vieira

Att'y.

INVENTOR.
Leo A. Plouffe
BY Joseph Gerard Vieira

Gerald B. Epstein Att'y.

INVENTOR.
Leo A. Plouffe
BY Joseph Gerard Vieira

Att'y.

TIME DELAY CIRCUIT EMPLOYING FIELD EFFECT TRANSISTOR AND DIFFERENTIAL OPERATIONAL AMPLIFIER

The present invention relates generally to timing circuits and more particularly is directed to an improved time delay circuit for providing a predetermined time delay between the initiation of a control signal and the production of an output signal which controls the state of energization of a load.

A variety of industrial power control systems are currently available for controlling the power being supplied to a load responsive to the operation of an input signal source. Often a relatively large number of sequencing operations must be controlled in a plurality of circuits and it is desirable to provide selected time delays between energization and/or de-energization of various portions of the system in response to input control signals to control the energization and de-energization of various loads. Certain difficulties have arisen in providing such systems particularly in view of the relatively large number of mechanical switches which may be required. Typically problems of wear, contact erosion, etc. as well as the inherent unreliability of systems which require repetitive physical movement of switching elements have given rise to an unacceptable degree of reliability and useful lifetime.

Accordingly, it is an object of the present invention to provide an improved timing circuit.

It is another object of the present invention to provide an improved timing circuit for providing a preselected time interval between the initiation of a control signal and the generation of an output signal, which controls the state of energization of a load.

It is a further object of the present invention to provide an improved timing circuit for providing a preselected time interval between the initiation of a control signal and the production of an output signal which controls the state of energization of a load, which time delay circuit uses a relatively minimal number of electromechanical components, is durable in use, and economical to fabricate.

Various additional features and advantages of the present invention will be readily apparent from the following detailed description and the accompanying drawings wherein.

Figures 1, 2:
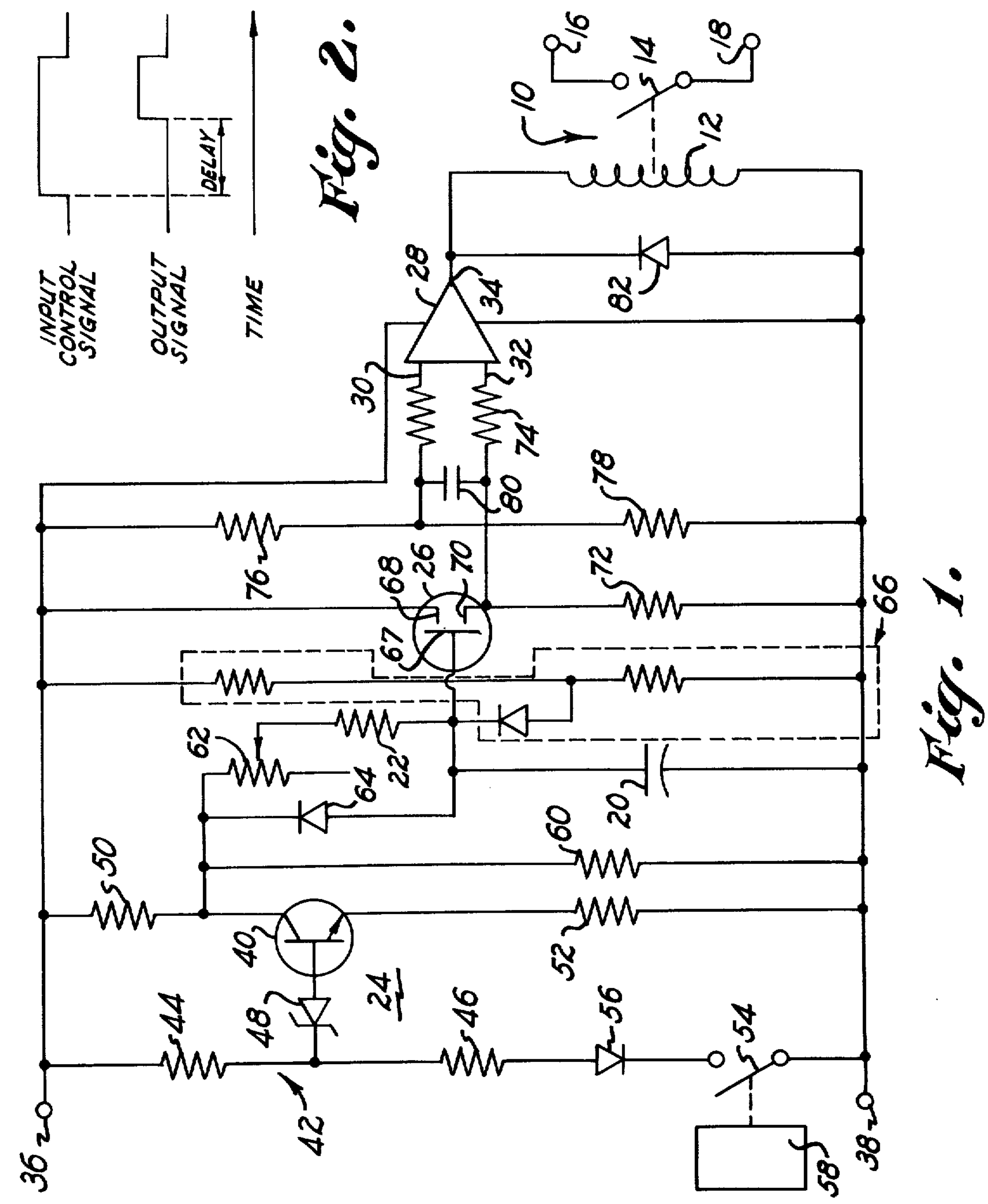
FIG. 1 is a schematic circuit diagram of one embodiment of a timing system in accordance with the present invention.
FIG. 2 is a diagram illustrating the operation of the system shown in FIG. 1.

Referring generally to the drawings and initially to FIG. 1, an electrical control system is shown for controlling the state of energization of a selectively energizable output switch means 10, comprising a selectively energizable relay coil 12 operatively connected to a pair of relay contacts 14 the opening and closing of which control the power applied across a pair of output terminals 16, 18 connected thereto. The timing circuit includes an interconnected capacitor 20 and a resistor 22 which define a time delay network. Charging and discharging of the capacitor in predetermined time intervals is controlled by a selectively energizable input switch means 24 responsive to the initiation of a control signal. A voltage sensing switch control means 26 is connected across the output of the capacitor for sensing the voltage thereacross and producing an energizing signal systematically related to this voltage. In addition, a comparison means 28 having first and second input terminals 30, 32 respectively and an output terminal 34 is connected to the voltage sensing switch control means 26. The first input terminal 30 is adapted to receive a bias signal at a preselected voltage level relative to the voltage level at the second input terminal 32 for maintaining the comparison means in a first or de-energized state, while the second input terminal 32 is coupled to the voltage sensing switch control means for receiving the energizing signal. The comparison means 28 operates in a second or energized state only when the energizing signal applied at its input terminal 32, is of a predetermined magnitude relative to the bias signal applied at its input terminal 30, and provides an output signal only when operating in its energized state. The output terminal 34 of the comparison means 28 is coupled to the selectively energizable output switch means 10 and hence serves to control the state of energization of the load.

More particularly, the embodiment illustrated in FIG. 1 comprises an "on-delay" timing circuit in which a preselected time delay is provided between the initiation of an input control signal and the generation of an output signal as particularly shown graphically in FIG. 2. Operating power for the system is applied across a pair of input power supply terminals 36, 38 and may comprise suitable half-wave rectified a.c. power. The selectively energizable input switch means 24 includes a normally "on" transistor 40 which is shown as an NPN transistor having its base coupled to a voltage divider 42 defined by a pair of resistors 44, 46 connected across the power supply terminals. In addition, a voltage threshold trigger device 48, such as zener diode, is connected between the base of transistor 40 and the voltage divider 42 so as to achieve more accurate control of the initiation of conduction of transistor 40. The collector of the transistor 40 is connected to the input power supply terminal 36 through a voltage dropping resistor 50 and its emitter is connected to the other input power terminal 38 through another voltage dropping resistor 52, having a substantially lower resistance than resistor 50. Control of the conduction of transistor 40 is controlled by a selectively operable switch 54 comprising a pair of normally open switch contacts coupled to the base of the transistor through the resistor 46 and a half-wave rectifier diode 56. Operation of the switch contact 54 may be controlled manually, or as shown, by a source of input control signals indicated generally by the reference numeral 58 which generates input control signals for effecting operation of the switch controls 54 in order to control the operation of the system. A voltage sensing resistor 60 is connected across the collector-emitter circuit of transistor 40 and the resistor 52. The resistor 60 has a substantially greater resistance than the resistor 50 so that when the transistor 40 is in a non-conductive condition substantially all of the voltage applied across the input terminals 36, 38 is developed across the resistor 60. The time delay network including the capacitor 20 and resistor 22 is connected across the resistor 60 and the capacitor is charged to a preselected voltage level in a predetermined time interval responsive to the voltage across resistor 60 when the transistor 40 is non-conductive upon closure of switch 54. More particularly, the resistor 22 is also connected to a variable trim resistor 62 so as to permit more accurate control of the time interval required for charging the capacitor 20 to the preselected voltage level. Discharge of the capacitor 20 subsequent to the completion of charging thereof during a timing cycle is effected responsive to opening of the switch 54 which renders the transistor 40 conductive and permits discharge of the capacitor through a diode 64 which is connected between the capacitor and the collector of the transistor 40. The discharge path is completed through the collector-emitter circuit of the transistor 40 and through resistor 52. Thus, when the transistor 40 is in a conductive condition corresponding to the switch 54 being open, the capacitor 20 charging is prevented because the transistor 40 shunts the capacitor while closing of the switch 54 renders the transistor 40 non-conductive and permits the capacitor to be charged to the preselected voltage level in a predetermined time interval. In addition, a pedestal network 66 is preferably provided connected across the capacitor 20 and resistor 22 for assuring discharge of the capacitor to a constant preset voltage level, rather than permitting complete discharge thereof so that the capacitor is always charged to its preselected voltage level from a constant starting level in order to further assure accuracy of timing.

The voltage level established across the capacitor 20 is sensed by the voltage sensing switch control means 26 which in turn produces an energizing signal systematically related to this voltage. More particularly, in order to provide an impedance match between the time delay network and, in particular, the trim resistor 62 and the input of the comparison means 28 the voltage sensing switch control means 26 preferably comprises a buffer amplifier such as a field effect transistor having a relatively high input impedance and a relatively low output impedance, although in some instances a high input impedance comparison means may be employed obviating the need for an impedance matching buffer amplifier. The field effect transistor 26 includes gate 67 coupled to the junction between the capacitor 20 and the resistor 22, a drain 68 coupled to the input power supply terminal 36 and a source 70 connected to a voltage dropping source resistor 72. Thus, the field effect transistor 26 is connected in a source-follower configuration. During operation the voltage level at the source 70 of the field effect transistor 26 is substantially closely correlated with the gate voltage applied by the capacitor 20. The source voltage signal is applied to the second input terminal 32 of the comparison means 28 through a coupling resistor 74 and hence serves to energize the comparison means 28, when the voltage level at the source 70 of the field effect transistor 26 is at a sufficient level corresponding to the preselected voltage level across the capacitor 20. The first input terminal 30 of the comparison means 28 comprises a bias terminal and is connected to the junction between a pair of bias resistors 76, 78 which are connected across the input power supply terminals 36, 38 so that a substantially constant reference voltage is applied to the first input terminal. In addition, a common mode rejection filter capacitor 80 is connected across the input terminals of the comparison means 28.

The comparison means 28 preferably comprises a bistable device which provides an output signal to effect operation of the output switch means 10 when in its energized state and does not produce an output signal in its de-energized state. More particularly, the comparison means 28 preferably comprises a differential operational amplifier which may be provided in integrated circuit from, if desired, to further increase the miniaturization of the system, as well as to decrease the operating power requirements. In operation, when the voltage across the capacitor 20 has reached the preselected voltage level in the predetermined time interval, the requisite energizing signal is applied to the second input terminal 32 from the source 70 of the field effect transistor 26 and an output signal is produced by the differential operational amplifier 28 and applied to the output switch means 10 which as previously mentioned includes a relay 12 preferably comprising a reed relay. Energization of the reed relay in turn causes closing of the switch contacts 14 so as to control the state of energization of the load. In addition, a diode 82 is connected across the reed relay coil 12 in order to shunt energy stored in the relay coil 12 upon de-energization thereof so as to protect the output terminal 34 against inductive feedback effects.

Thus, to briefly summarize operation of the "on-delay" system illustrated in FIG. 1 in the absence of the application of a control signal the switch contacts 54 are in an open condition and the transistor 40 is in a conductive condition and hence shunts power from the capacitor 20 which is prevented from charging. Accordingly, the output signal provided at the source 70 of the field effect transistor 26 is of a relatively low magnitude and the bias signal applied at the input terminal 30 of the differential operational amplifier 28 maintains the differential operational amplifier in a de-energized condition. Upon closing of the switch contacts 54 the transistor 40 is rendered non-conductive and charging of the capacitor through the trim resistor 62 and resistor 22 is initiated. The capacitor charges to the preselected voltage level in the predetermined time interval and a substantially closely correlated voltage signal is developed across the source resistor 72 so that an energizing signal is applied to the second input terminal 32 of the differential operational amplifier 28, causing the differential operational amplifier to shift to its energized state, thereby generating an output signal which energizes the reed relay 12 so as to effect energization of the load.

Figures 3, 4:
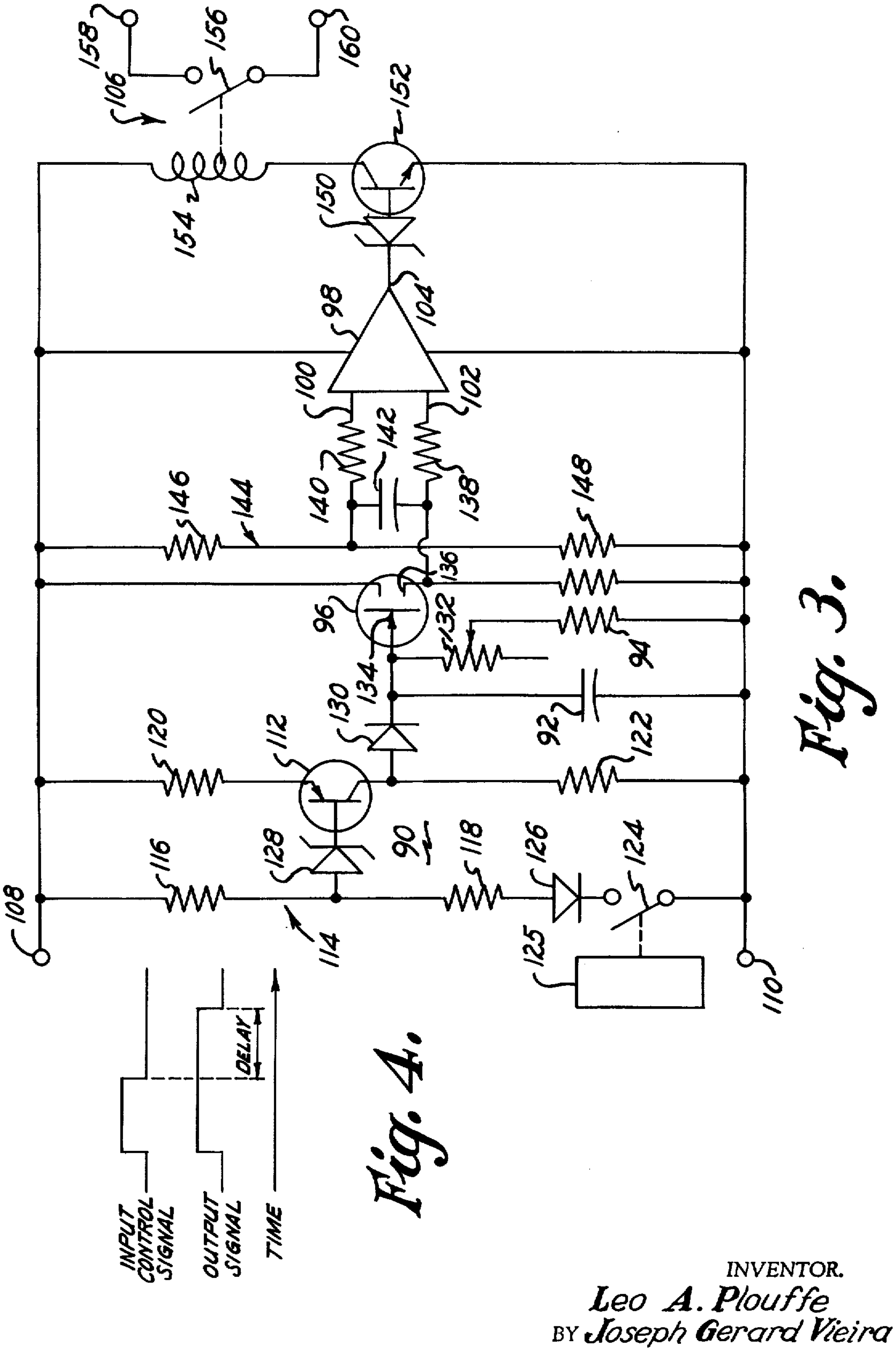
FIG. 3 is a schematic circuit diagram of another embodiment of a timing system in accordance with the present invention.
FIG. 4 is a diagram illustrating the operation of the system shown in FIG. 3.

Referring now to FIGS. 3 and 4 another embodiment of the present invention is illustrated which is quite similar to that illustrated in FIGS. 1 and 2 but which is adapted for operation as an "off-delay" system. In this embodiment, a predetermined time delay is provided between the removal of the input control signal and a change in state or de-energization of the load. More particularly, a selectively energizable input switch means 90 is similarly provided for controlling the charging and discharging of an interconnected capacitor 92 and resistor 94. A voltage sensing control means 96 is coupled to the capacitor 92 for generating an energizing voltage signal which varies between first and second voltage levels in close correlation with first and second preselected voltage levels respectively established across the capacitor corresponding to its charged and discharged state. A bi-stable voltage threshold detector 98 having first and second input terminals 100, 102 is provided having its first input terminal 100 adapted to be maintained at a substantially constant voltage reference level for maintaining the voltage threshold detector 98 in a de-energized state, the second input terminal 102 is coupled to the voltage responsive control means 96 so as to receive energizing voltage signals supplied therefrom for effecting operation of the voltage threshold detector means 98 in its energized state, when the energizing signal is at a sufficient level relative to that applied at the first terminal 100, corresponding to charging of the capacitor to its first preselected voltage level and for effecting operation of the threshold detector 98 in its de-energized state, when the energizing signal is at a second level corresponding to discharge of the capacitor to its second preselected voltage level upon expiration of the predetermined time interval required for discharging of the capacitor. The voltage threshold detector 98 generates an output signal at an output terminal 104 only during operation in its energized state, this output signal being coupled to a selectively energizable output switch means 106 which controls the state of energization of the load.

More particularly, half-wave rectified a.c. power for the system is again applied across a pair of power supply input terminals 108, 110, while the selectively energizable input switch means 90 includes a normally nonconductive transistor 112, which is illustrated as a PNP transistor having its base coupled to a voltage divider configuration 114 defined by a pair of resistors 116, 118 connected across the power supply terminals. The emitter of the PNP transistor 112 is connected to power supply terminal 108 through a voltage dropping resistor 120 while its collector is connected to power supply terminal 110 through a similar voltage dropping resistor 122 which has a substantially greater resistance than the resistor 120. Operation of the system for effecting de-energization of the output switch means 106 responsive to an input control signal after expiration of a predetermined time delay is effected by a selectively operable switch 124 shown coupled to an input control signal source 125, which is adapted to effect opening and closing of the switch 124. The switch 124 controls the conduction of the transistor 112 and is coupled to the voltage divider through a half-wave rectifier diode 126. In addition, the base of transistor 112 is coupled to the voltage divider 114 through a voltage threshold sensing device 128, such as a zener diode, for effecting smooth control of the conduction and non-conduction of the transistor 112. It may be seen that when the switch 124 is in its open position the transistor 112 is maintained in an "off" or non-conductive state, while closure of the switch 124 renders the transistor 112 conductive. The collector of transistor 112 is connected to the time delay network, which includes a capacitor 92 and a resistor 94 through a coupling diode 130, as shown. In addition, a selectively variable trim resistor 132 is connected to the resistor 94 so as to provide more accurate control of the time delay. Operation of the system is initiated by initially closing the switch 124 responsive to an input control signal which substantially instantaneously results in the generation of an output signal, as shown in FIG. 4. In this regard, closure of the switch 124 renders the transistor 120 conductive and causes the capacitor 92 to be charged to a preselected voltage level through diode 130 and through the resistors 94 and 132 in a relatively rapid time interval. The voltage responsive control means 96 preferably comprises a field effect transistor having a high input impedance and a relatively low output impedance. Accordingly, the voltage at the gate 134 of the field effect transistor 96 which is coupled to the capacitor 92 causes the establishment of a relatively closely correlated output signal at its source 136. This output signal, which may be referred to as an energizing voltage signal is applied to the second input terminal 102 of the bi-stable voltage threshold detector 98 through a current limiting resistor 138. Similarly, to the FIG. 1 embodiment, a substantially constant reference voltage or bias signal is applied to the first input terminal 100 of the voltage threshold detector means 98 through another coupling resistor 140, while a common mode rejection filter capacitor 142 is coupled between the input terminals 100, 102. The input terminal 100 is supplied with bias signals by a voltage divider configuration 144 which includes resistors 146, 148 connected across the power supply terminals 108, 110. When the energizing signal applied at the second input terminal 102 is of a sufficient magnitude corresponding to the charging of the capacitor 92 to its first preselected voltage level the bi-state voltage threshold detector means 98 is energized and generates the output signal.

The bi-stable voltage threshold detector means 98 once again preferably comprises a differential operational amplifier having two states of operation. In its first state the bias signal applied at its first input terminal is sufficient in magnitude relative to the signal applied at its second input terminal 102 to maintain the differential operational amplifier in a de-energized state. In its second state the voltage energizing signal supplied by the field effect transistor 96 associated with charging of the capacitor 92 to its first preselected voltage level is sufficient to cause the differential operational amplifier 98 to switch to an energized state whereupon it generates an output signal at its output terminal 104. The output terminal 104 is coupled to the output switch means 106 through a threshold trigger device 150, such as a zener diode, which is connected to the base of an NPN amplifier transistor 152. The collector-emitter circuit of the NPN transistor 152 is in turn connected to the output switch means 106 which preferably comprises a selectively energizable reed relay 154 operatively connected to a pair of relay contacts 156 which control the state of energization of a pair of load terminals 158, 160. The zener diode 150 and input transistor 152 are utilized in this embodiment in order to obtain more accurate control of the de-energization of the output switch 106 in view of fluctuations in the voltage wave form which may occur at the source terminal 136 of the field effect transistor 96 during the initial application of power to the system.

Operation of the "off-delay" timing wherein the selectively energizable switch means 106 is de-energized subsequent to the expiration of a predetermined time interval is effected by opening of the switch 124, subsequent to its closure and the charging of the capacitor 92. More particularly, closure of switch 124 results in the capacitor 92 being charged to a first preselected voltage level with a relatively closely correlated output energizing voltage level being developed at the source 136 of field effect transistor 96, which renders the bistable differential operational amplifier 98 energized and energizes the relay coil 154. Similarly, opening of the switch 124 renders the transistor 112 non-conductive and effects discharging of the capacitor 92 to a second preselected voltage level in a predetermined time interval. The capacitor 92 discharges through the trim resistor 132 and the resistor 94 since it cannot discharge through the back-biased diode 130. The decreasing voltage level across the capacitor 92 is sensed by the gate 134 of the field effect transistor and accordingly a corresponding decreasing voltage level is established across the source 136 of the field effect transistor. When the capacitor 92 has discharged to its second preselected voltage level, the energizing output signal supplied to the second input terminal 102 of the bi-stable differential operational amplifier 98 is insufficient to maintain the bi-stable differential operational amplifier in its energized state and no output signal is generated at its output terminal 104. Correspondingly, the zener diode 150 is rendered non-conductive as is the output transistor 152 and the relay coil 154 is de-energized. Thus, it may be seen that a predetermined time delay i.e., that required for discharge of the capacitor to its second preselected voltage level is required between the time at which the switch 124 is opened and the de-energization of the load is indicated by the "Delay" in FIG. 4.

Figure 5:
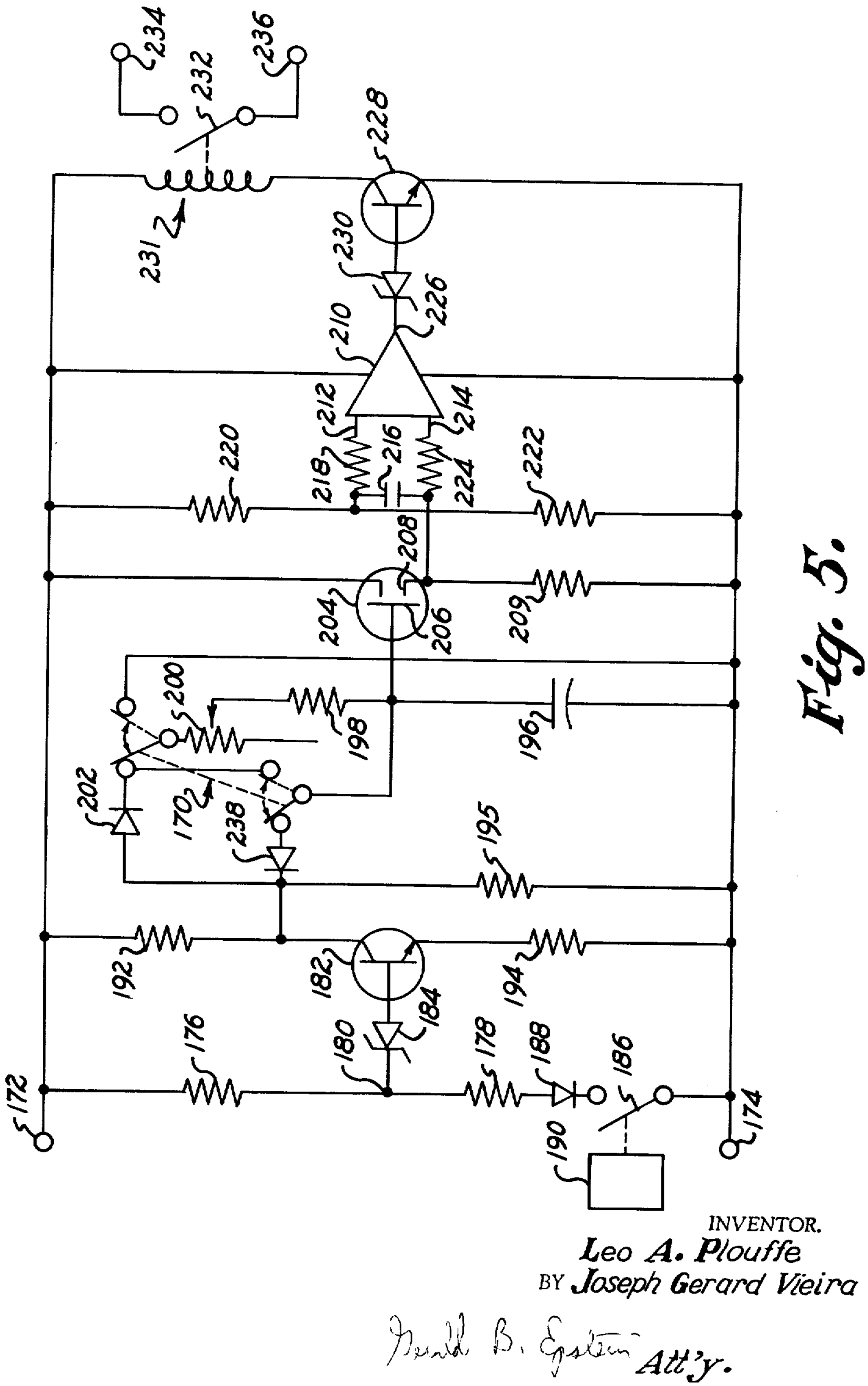
FIG. 5 is an electrical schematic circuit diagram of another embodiment of the present invention.

Referring now to FIG. 5 another embodiment of a time delay system is illustrated which is operable as either an "on-delay" system or an "off-delay" system depending upon the operation of a switch means 170, which preferably comprises a double-pole, double-throw relay. In the position of the relay shown in solid lines the system illustrated operates as an "on-delay" similarly to the FIG. 1 embodiment, whereas when the relay contacts are moved to the position shown in phantom the system operates as an "off-delay" system, as illustrated in FIG. 3. More particularly, this system similarly includes a pair of input power supply terminals 172, 174 for supplying half-wave rectified a.c. power to the system. A pair of resistors 176, 178 are connected across the input power supply terminals 172, 174 and define a voltage divider having a junction 180, which is coupled to the base of an NPN input switch transistor 182 through a threshold trigger device 184, such as a zener diode. In addition, an input control switch 186 is provided coupled to the resistors 176 and 178 through a half-wave receifier diode 188, the opening and closing of the switch 186 being controlled by a source of input control signals 190. In addition, a voltage dropping resistor 192 is connected between power supply terminal 172 and the collector of transistor 182, and another voltage dropping resistor 194 having a substantially higher resistance than the resistor 192 is connected to the emitter of the transistor 182, while a voltage sensing resistor 195 is connected across the collector-emitter circuit of transistor 182 and resistor 194. A capacitor 196 is connected to the junction between the resistor 192 and the collector of transistor 182 through a resistor 198 and a variable trim resistor 200, which define the time delay network, and through a half-wave rectifier diode 202. While the switch 186 remains in its open position and the transistor 182 is conductive it functions to shunt current away from the capacitor 196 and hence charging of the capacitor 196 is prevented. A voltage responsive control means 204 preferably comprising a field effect transistor is provided having its gate 206 connected to the capacitor, while a varying energizing signal is provided at its source 208 responsive to the voltage across the capacitor 196. This energizing signal is developed across a voltage dropping source resistor 209, which is connected to the source 208. A bi-stable voltage threshold detector 210, preferably comprising a bi-stable differential operational amplifier is provided having a first input terminal 212 and a second input terminal 214 with a common mode rejection filter capacitor 216 connected between the terminals. The first terminal 212 functions as the bias terminal for applying a substantially constant reference voltage to the differential operational amplifier 210 to maintain the differential operational amplifier 210 in a de-energized state. The first terminal 212 is connected through a current limiting resistor 218 to a voltage divider junction 219 between a pair of resistors 220, 222 connected across the power supply terminals 172, 174 for establishing the requisite bias level at the first terminal 212. The second output terminal 214 is coupled to the source 208 through a current limiting resistor 224, as shown, and hence senses the voltage level at the source which is closely correlated with the voltage established across the capacitor 196. The differential operational amplifier 210 further includes an output terminal 226 which supplies an output signal when a sufficient energizing signal is applied to the second terminal 214 to render the differential operational amplifier energized. The output terminal 226 is coupled to an NPN output amplifier transistor 228 through a threshold trigger device 230 such as a zener diode, the collector-emitter circuit of this transistor being connected in series with a selectively energizable output switch 231 preferably comprising a reed relay operatively connected to a pair of relay contacts 232, the opening and closing of which control the state of energization of a pair of load terminals 234, 236.

Thus, in operation when the relay 170 is in the solid line position illustrated and the system operates as an "on-delay," upon closure of the switch 186 the transistor 182 is rendered non-conductive and the capacitor 196 charges to a first preselected voltage level in a predetermined time interval through the resistor 192, the diode 202, the trim resistor 200, and the resistor 198. The increasing voltage level established across the capacitor 196 is sensed by the gate 206, and a corresponding energizing output signal 200 is established at the source terminal 208 so as to energize the differential operational amplifier 210, when the capacitor is charged to its first preselected voltage level, thereby rendering the output switch 231 energized upon expiration of the predetermined time interval required for the capacitor 196 to charge to the first preselected voltage level. When the switch 186 is opened the transistor 182 is rendered conductive which prevents further charging of the capacitor 196 and causes the capacitor to discharge through a diode 238 and through the collector-emitter circuit of the transistor 182 which is connected to the diode 238.

When the contacts of the relay 170 are moved to the position shown in phantom the system operates as an "off-delay." Accordingly, the switch 186 is initially closed to effect charging of the capacitor 196 to its first preselected voltage level which results in energizing the differential operational amplifier and the output switch means 230. the off-delay function is accomplished by then effecting opening of the switch 186 which renders the transistor 182 conductive and prevents further charging of the capacitor. The capacitor is prevented from discharging through the transistor 182 by the reverse biased diode 202 and accordingly discharges in a predetermined time interval to its second preselected voltage level through resistors 198 and 200. The energizing signal at the source 208 again substantially closely tracks the voltage level at the capacitor 196 and accordingly the voltage energizing signal applied to the second input terminal 214 of the differential operational amplifier 210 similarly decreases as the capacitor discharges. When the capacitor has discharged to its second preselected voltage level the voltage at the drain 208 becomes insufficient to maintain the differential operational amplifier 210 in its energized condition and accordingly the zener diode 230 and the output transistor 228 are de-energized which effects corresponding de-energization of the output relay 230.

Thus, several embodiments of improved time delay systems have been shown and described in detail in which a predetermined time delay is provided between the initiation of an input control signal and a change in the state of energization of a load.

Various modifications and changes in the above-described embodiments will be readily apparent to those skilled in the art and any of such changes or modifications are deemed to be within the spirit and scope of the present invention as set forth in the appended claims.

We claim:

1. In an electrical control system for controlling the state of energization of a load responsive to an input control signal, a timing circuit for providing a predetermined time delay between initiation of the control signal and a change in the state of energization of the load, said timing circuit comprising a time delay network including an interconnected resistor and capacitor, selectively energizable input switch means connected to said time delay network for effecting charging and discharging of said capacitor in predetermined time intervals responsive to the initiation of the control signal, a voltage sensing switch control means connected to said capacitor for sensing the voltage thereacross and producing an energizing signal systematically related to said voltage, comparison means including first and second input terminals and an output terminal, means for providing said first input terminal with a bias signal having a preselected voltage level relative to the voltage level at said second input terminal for maintaining said comparison means in a de-energized state and said second input terminal being connected to said voltage sensing switch control means for receiving said energizing signal, said comparison means being energized only when said energizing signal is of a predetermined magnitude relative to said bias signal so as to provide an output signal responsive to energization thereof, and selectively operable output switch means connected to said output terminal for controlling the state of energization of the load.

2. In a system in accordance with claim 1 wherein said comparison means comprises a bi-stable device which provides an output signal to effect operation of said output switch means in only one of its states.

3. In a system in accordance with claim 2 wherein said comparison means is maintained in said one state in response to the establishment of a preselected voltage level across said capacitor.

4. In a system in accordance with claim 3 wherein said comparison means comprises a differential operational amplifier.

5. In a system in accordance with claim 4 wherein said voltage sensing switch control means comprises a buffer amplifier having an input terminal coupled to said capacitor and having an output terminal coupled to said second input terminal of said differential operational amplifier for effecting an impedance match therebetween.

6. In a system in accordance with claim 5 wherein said buffer ammplifier has a relatively high input impedance and a relatively low output impedance so as to generate said energizing signal at its output terminal in relatively close correlation with the voltage level across said capacitor.

7. In a system in accordance with claim 6 wherein said buffer amplifier comprises a field effect transistor.

8. In a system in accordance with claim 7 wherein said field effect transistor is connected in a source follower configuration having its gate connected to said capacitor and having its source coupled to said second input terminal of said differential operational amplifier.

9. In an electrical control system for controlling the state of energization of a load responsive to a control signal, a timing circuit for providing a predetermined time delay between initiation of the control signal and the production of an output signal, said timing circuit comprising, a time delay network including an interconnected resistor and capacitor, selectively energizable input switch means connected to the time delay network for effecting the charging of said capacitor to a first preselected voltage in a predetermined time interval, a voltage responsive control means connected to said capacitor for generating a varying energizing signal which varies in close correlation with the voltage level established across said capacitor during charging thereof, bi-stable voltage threshold detector means having first and second input terminals and an output terminal, means to maintain said first input terminal at a substantially constant reference voltage level relative to the voltage level at said second input terminal for maintaining said voltage threshold detector means in its first state, said second input terminal being connected to said voltage responsive control means so as to receive said varying energizing signal thereat for effecting operation of said voltage threshold detector means in its second state when said varying energizing signal reaches a preselected magnitude relative to said reference voltage level at said first input terminal upon expiration of said predetermined time interval during charging of said capacitor, said detector means generating an output signal only during operation in its second state, and selectively energizable output switch means connected to said output terminal of said threshold detector for controlling the state of energization of the load, said output switch means being energized by said output signal.

10. In a system in accordance with claim 9 wherein said voltage responsive control means comprises a buffer amplifier coupled between said resistor and said second input terminal for effecting an impedance match between said resistor and said second output terminal.

11. In a system in accordance with claim 10 wherein said buffer amplifier includes a field effect transistor having a relatively high input impedance and a relatively low output impedance.

12. In a control system in accordance with claim 11 wherein said bi-stable voltage threshold detector comprises a differential operational amplifier.

13. In a control system for controlling the state of energization of a load responsive to a control signal, a timing circuit for providing a predetermined time delay between initiation of the control signal and the cessation of an output signal, said timing circuit comprising a time delay network including an interconnected resistor and capacitor, selectively energizable input switch means connected to the time delay network for effecting charging of said capacitor to a first preselected voltage level and for subsequently effecting discharging of said capacitor to a second preselected voltage level in a predetermined time interval, voltage responsive control means connected to said capacitor for generating an energizing voltage signal which varies between first and second levels in close correlation with the first and second preselected voltage levels respectively across said capacitor, a bi-stable voltage threshold detector means having a first and second input terminals and an output terminal, means to maintain said first input terminal at a first substantially constant reference voltage level effecting operation of said voltage threshold detector in its first state, said second input terminal being connected to said voltage responsive control means so as to receive said energizing voltage signal thereat for effecting operation of said voltage threshold detector means in its second state when said energizing signal is at said first level corresponding to charging of said capacitor to said first preselected voltage level and for effecting operation of said voltage threshold detector means in its first state when said energizing signal is at said second level corresponding to discharge of said capacitor to said second preselected voltage level upon expiration of said predetermined time interval, said voltage threshold detector means generating a signal at its output terminal only during operation in its second state, and selectively energizable output switch means connected to said output terminal of said voltage threshold detector means for controlling the state of energization of the load, said output switch means being de-energized responsive to operation of said voltage threshold detector means in its first state accompanying discharge of said capacitor to said second preselected voltage level upon expiration of said predetermined time interval.

14. In a control system in accordance with claim 13 wherein said voltage responsive control means comprises a buffer amplifier coupled between said resistor and said second input terminal for effecting an impedance match therebetween.

15. In a control system in accordance with claim 14 wherein said buffer amplifier includes a field effect transistor having a relatively high input impedance and a relatively low output impedance.

16. In a control system in accordance with claim 14 wherein said bi-stable voltage threshold detector comprises a differential operational amplifier.

17. In a control system in accordance with claim 1 including power input terminals, the selectively energizable input switch means includes an NPN transistor whose emitter-collector is connected across the power input terminals, a junction formed between the resistor and capacitor of the time delay network, the collector connected to the junction, a voltage divider having two legs and a junction therebetween connected across the input power terminals, the base of the transistor connected to the voltage divider junction and a switch in one leg of the voltage divider such that when the switch in the voltage divider leg is open the transistor is conductive shunting current from the capacitor and upon closing of the switch the transistor is rendered nonconductive and the capacitor is charged.

18. In a control system in accordance with claim 1 the time delay network includes a double pole double throw relay to obtain in one position an on delay and in the other position an off delay.

* * * * *